United States Patent
Oshika

[11] Patent Number: 5,545,490
[45] Date of Patent: Aug. 13, 1996

[54] SURFACE COATED CUTTING TOOL

[75] Inventor: Takatoshi Oshika, Ibaraqi-ken, Japan

[73] Assignee: Mitsubishi Materials Corporation, Tokyo, Japan

[21] Appl. No.: 262,829

[22] Filed: Jun. 21, 1994

[51] Int. Cl.⁶ .................................................. G32B 15/04
[52] U.S. Cl. ........................ 428/701; 428/698; 428/702; 51/307; 51/309
[58] Field of Search .................................. 428/698, 701, 428/702; 51/307, 309

[56] References Cited

U.S. PATENT DOCUMENTS

| | | | |
|---|---|---|---|
| 4,180,400 | 12/1979 | Smith et al. | 75/235 |
| 4,463,062 | 7/1984 | Hale | 428/702 |
| 4,629,661 | 12/1986 | Hillert et al. | 428/701 |
| 4,749,630 | 6/1988 | Konig et al. | 428/698 |
| 4,984,940 | 1/1991 | Bryant et al. | 428/698 |

OTHER PUBLICATIONS

Vuorinen et al "Characterization of $\alpha Al_2O_3$, and $\alpha$–$\kappa$ $Al_2O_3$ Multioxide Coatings on Cemented Carbides" Thin Solid Films, 193/194 (1990) pp. 536–546.

Chatfield "Characterization of the Interfaces in Chemical Vapour Deposited Coatings on Cemented Carbides" RM & HM Sep. 1990 pp. 132–138.

Primary Examiner—Archene Turner
Attorney, Agent, or Firm—Armstrong, Westerman, Hattori, McLeland, & Naughton

[57] ABSTRACT

A cutting tool whose surface is coated with a composite hard layer formed by chemical vapor deposition and having excellent wear resistance and chipping resistance. The cutting tool contains a substrate whose surface is coated with a composite hard layer containing an inner layer including one or more layers of titanium carbide, titanium nitride, titanium carbonitride, titanium carboxide, and titanium oxicarbonitride, and an outer layer including at least one alumina layer. The alumina layer contains K-type alumina such that an X-ray intensity ratio $I_A/I_B$ of two specific crystal faces A and B in X-ray diffraction is not smaller than 2, where the A-face and B-face denote faces of K-type alumina defined as those whose interfacial distances are 2.79Å and 2.57Å in ASTM4-0878, and $I_A$ and $I_B$ denote X-ray intensity of the faces A and B in X-ray diffraction.

9 Claims, 1 Drawing Sheet

SURFACE COATED CUTTING TOOL

BACKGROUND OF THE INVENTION

1. Field of the Invention

The present invention relates to a surface coated cutting tool having excellent wear resistance and chipping resistance, the cutting tool including a cemented carbide substrate whose surface is coated with a composite hard layer formed by means of chemical vapor deposition, the composite hard layer consisting substantially of an inner layer including one or more layers of titanium carbide, titanium nitride, titanium carbonitride, titanium carboxide, and titanium oxicarbonitride (hereinafter referred to generally as titanium compound layers), and an outer layer including at least one alumina layer.

2. Description of the Related Art

For the purpose of continuous and interrupted cutting of steel, it has been well known to use a surface coated cutting tool including a cemented carbide substrate whose surface is coated with a composite hard layer formed by means of chemical vapor deposition, the composite hard layer consisting substantially of an inner layer including a titanium compound layer and an outer layer including at least one alumina layer.

The alumina layer is chemically stable and excellent in face wear resistance, but is poor in adhesion property to the substrate and toughness. Thus, the surface of the cemented carbide substrate is coated first with a titanium compound layer formed by means of chemical vapor deposition, then an alumina layer is formed on the titanium compound layer by means of chemical vapor deposition, thereby giving wear resistance and toughness to the formed composite hard layer to improve chipping resistance.

As a method for forming the alumina layer of the composite hard layer by means of chemical vapor deposition, there is known a method for speeding up a growth rate of the alumina layer by use of reaction gas obtained by adding 0.01 to 1.0 vol. % of hydrogen sulfide gas to conventional reaction gas.

The use of this method shortens a time during which the inner layer made of titanium compound and the cemented carbide substrate are held at high temperature, thereby making the structure of the inner layer and the substrate unliable to change. Thus it is said that a surface coated cutting tool having a better performance than the conventional ones is obtainable according to this method (refer to, for example, Japanese Examined Patent Publication 62-3234).

The alumina layer obtained by use of reaction gas containing 0.01 to 1.0 vol. % of hydrogen sulfide gas is mainly an α-type alumina layer. It is also known that a K-type alumina layer is obtainable by changing the volume of carbonic acid gas in the reaction gas.

In recent years, there has been an increasing demand for a labor-saving and shorter cutting operation. This demand requires strongly a high speed continuous and interrupted cutting operation such as high speed feeding and high speed cutting under more severe conditions. During the high speed cutting operation, the temperature of a cutting edge rises above 1000° C. and steel chips of exceedingly high temperature pass along a face of a cutting tool, which accelerates wear of the face. Thus, the cutting tool is chipped or damaged at a relatively early stage. Under these severe conditions, the cutting tools coated with the composite hard layer including the conventional alumina layer have had a relatively short lifetime of use because the coated layer has insufficient wear resistance and chipping resistance.

SUMMARY OF THE INVENTION

In view of the above, the inventors of the present invention have made a research to develop a cutting tool whose surface is coated with a composite hard layer including an alumina layer having better wear resistance and chipping resistance than the prior art and have obtained the following results.

The present invention provides a cutting tool comprising a substrate whose surface is coated with a composite hard layer consisting substantially of an inner layer including one or more layers of titanium compounds, and an outer layer including at least one alumina layer containing a K-type alumina such that an X-ray intensity ratio of two specific crystal faces in X-ray diffraction is not smaller than 2. The cutting tool has better wear resistance and chipping resistance compared with the conventional cutting tools coated with a composite hard layer including the conventional alumina layer.

The invention was contrived based on these research results.

DETAILED DESCRIPTION OF THE INVENTION

Figure 1:
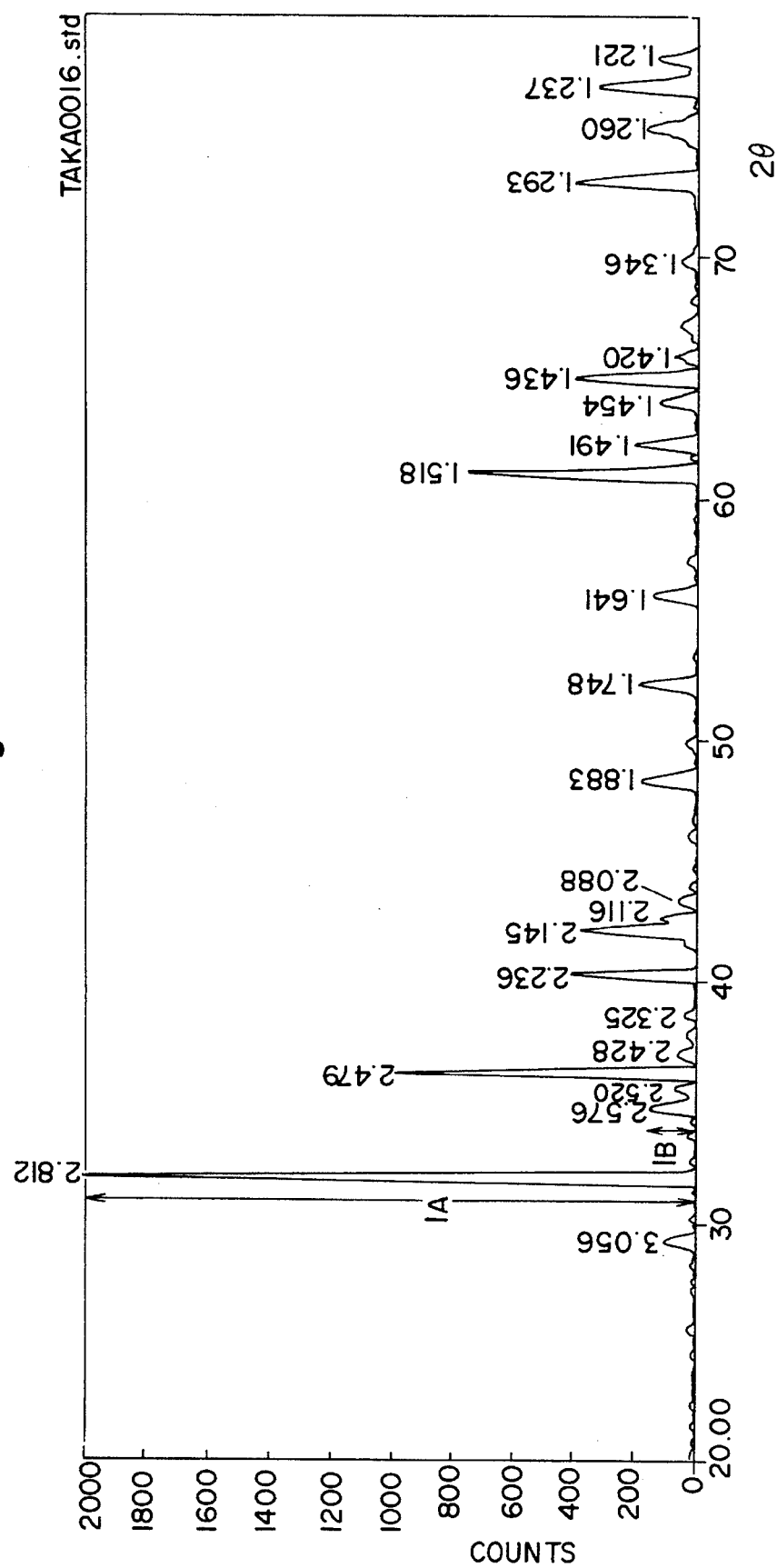
FIG. 1 is a graph showing X-ray diffraction of a surface coated cutting tool according to the present invention.

The present invention is directed to a cutting tool comprising a substrate whose surface is coated with a composite hard layer including an inner layer having one or more layers of titanium carbide, titanium nitride, titanium carbonitride, titanium carboxide, and titanium oxicarbonitride, and an outer layer having at least one alumina layer, wherein the alumina contains a K-type alumina layer such that an X-ray intensity ratio $I_A/I_B$ of two specific crystal faces A and B in X-ray diffraction is not smaller than 2, where the A-face and B-face denote faces of K-type alumina defined as those whose interfacial distances are 2.79Å and 2.57Å in ASTM4-0878, and $I_A$ and $I_B$ denote X-ray intensity of the faces A and B in X-ray diffraction.

The reason why the cutting tool according to the invention has better wear resistance and better chipping resistance compared with the conventional ones is thought to be that an abnormal damage caused by the friction between steel chips and the tool is unlikely to occur because K-type alumina demonstrating orientation to the face A makes the surface of the coated layer smooth. Thus, when the alumina layer contains such special K-type alumina that a ratio of X-ray intensity $I_A$ of the face A to that $I_B$. of the face B in X-ray diffraction is not smaller than 2, i.e., $I_A/I_B \geq 2$, wear resistance and chipping resistance improve further. Thus, the cutting tool whose surface is coated with the composite hard layer including this alumina layer has a longer lifetime even under the severe working conditions such as high speed cutting.

Besides special K-type crystals whose X-ray intensity ratio ($I_A/I_B$) is not smaller than 2, the alumina layer according to the invention may contain alumina having a different crystallographic structure. However, it is desirable that an amount of special K-type crystals in the alumina layer be at least not less than 30%, preferably not less than 50%, and most preferably not less than 70%. A percentage of special v-type crystals is obtained from the following equation:

Percentage of special κ-type crystals =

$$\frac{\text{sum of counts of all the peaks of } \kappa \cdot Al_2O_3 \text{ in X-ray diffraction}}{\text{sum of counts of all the peaks of } Al_2O_3 \text{ in X-ray diffraction}} \times 100$$

It is not necessary that the alumina layer be an outermost layer. At least one layer of titanium compound may be formed on the alumina layer.

A method for forming the inventive alumina layer containing special K-type crystals whose peak intensity ratio ($I_A/I_B$) is not smaller than 2 is as follows.

During an alumina coating reaction, a substrate coated with titanium compounds is held in mixed gas containing no $CO_2$ gas, but $AlCl_3$, $H_2$ and, if necessary, HCl for a predetermined time in the first step, and is subsequently caused to react in mixed gas containing $CO_2$, $AlCl_3$ and, if necessary, HCl in the second step.

It will be appreciated that the mixed gas used for the coating reaction may further contain $H_2S$ if necessary.

Conditions for the alumina coating reaction are written in detail below:

First Step

Temp.: 800° to 1050° C., Time: 1 to 120 min.

Gas Composition: 0.5 to 20 vol. % of $AlCl_3$, 0 to 20 vol. % of HCl, remainder $H_2$ Second Step Temp.: 800° TO 1050° C.

Gas Composition: 0.5 to 30 vol. % of $CO_2$, 0.5 to 20 vol. % of $AlCl_3$, 0 to 20 vol. % of HCl, remainder $H_2$ If necessary, 0.01 to 5 (vol) % of $H_2S$ may be added at the beginning or in the middle of the second step. The composition of the mixed gas may be changed continuously during the transition from the first step to the second step.

The surface coated cutting tool according to the invention will be described more in detail by way of an example.

EXAMPLE

Mixed powder of formulation of 87%WC—2%TiC—1%TiN—4%TaC—6%Co was prepared according to a conventional method. Thus prepared mixed powder was compressed into a green compact, which was then sintered at a temperature of 1410° C. in vacuum for 1 hour. In this way, a cemented carbide substrate A of the form of ISO SNMG120408 was prepared. 10 Similarly, mixed powder of formulation of 82%WC—5%Ti—5%TaC—8%Co was prepared according to a conventional method. Thus prepared mixed powder was compressed into a green compact, which was then sintered at temperature of 1380° C. in vacuum for 1 hour. In this way, a cemented carbide substrate B of the form of ISO SNMG 120408 was prepared.

On the surface of the cemented carbide substrate A, there was a tough surface layer of thickness of 20 μm including substantially no hard disperse phase (Ti, Ta, W) (C, N) and having a Co amount increased at maximum to 1.8 times of an internal Co-amount. On the other hand, there was almost no difference in structure between the surface and internal portions of the cemented carbide substrate B.

A honing of as large as 0.05R was applied to cutting edges of thus obtained cemented carbide substrates A and B and the surfaces of the substrates were washed. The inventive surface coated cutting tools 1 to 8 were manufactured by coating the surface of the substrate A under the conditions specified in TABLE-1 to TABLE-7 and by coating the surface of the substrate B under the conditions specified in TABLE-8. FIG. 1 is a graph showing X-ray diffraction of such a surface coated cutting tool according to the invention. TABLE-18 shows the results of evaluating FIG. 1 according to ASTM 4-0878.

For the purpose of comparison, the conventional surface coated cutting tools 1 to 8 were manufactured by coating the surface of the substrate A under the conditions specified in TABLE-9 to TABLE-15 and by coating the surface of the substrate B under the conditions specified in TABLE-16.

X-ray diffraction was conducted for the inventive cutting tools 1 to 8 and the conventional cutting tools 1 to 8 to measure an X-ray intensity ratio $I_A/I_B$. The measurement results are shown in TABLE-17.

Further, a continuous cutting test and an interrupted cutting test were conducted for the above cutting tools under the following conditions. A wear width on a flank was measured in the former test, whereas a lapse of time until chipping was measured in the latter test. The measurement results in the respective tests were again shown in TABLE-17.

CUTTING TEST CONDITIONS

Continuous Cutting

Work piece: JIS SCM440 (hardness: $H_B$ 220) round bar

Cutting speed: 250 m/min.

Feed rate: 0.3 mm/rev.

Cutting depth: 1.5 mm

Cutting time: 20 min.

Coolant: none

Interrupted Cutting

Work piece: JIS SNCM439 (hardness: $H_B$ 280) rectangular bar

Cutting speed: 100 m/min.

Feed rate: 0.236 mm/rev.

Cutting depth: 3.0 mm

Cutting time: 30 min.

Coolant: none

TABLE 1

| LAYER | TYPE OF LAYER | THICK-NESS (μm) | REAC. TEMP. (°C.) | PRES-SURE (Torr) | REACTION CONDITIONS | | | | | | | | | |
|---|---|---|---|---|---|---|---|---|---|---|---|---|---|---|
| | | | | | TIME (MIN) | REACTION GAS COMPOSITION (VOL %) | | | | | | | | |
| | | | | | | $TiCl_4$ | $CH_4$ | $CH_3CN$ | $N_2$ | CO | $AlCl_3$ | $CO_2$ | $H_2S$ | $H_2$ |
| 1st | TiN | 0.2 | 910 | 50 | | 2 | | | 25 | | | | | REM. |
| 2nd | TiCN | 9.0 | 910 | 50 | | 2 | | 0.6 | 25 | | | | | REM. |
| 3rd | TiCNO | 0.5 | 1010 | 50 | | 2 | 1 | | 23 | 1 | | | | REM. |
| 4th | $Al_2O_3$ | 2.0 | 1010 | 50 | 10 | | | | | | 3 | | | REM. 1st STEP |
| | | 2.0 | 1010 | 50 | 10 | | | | | | 2 | 4 | | REM. 2nd |
| | | 2.0 | 1010 | 50 | 120 | | | | | | 2 | 4 | 0.3 | REM. STEP |

(REM. denotes remainder)

```
    ┌─────────┐
    │ 3rd Layer │
  ┌─┴─────────┴─┐
  │  2nd Layer   │
┌─┴─────────────┴─┐
│    1st Layer     │
├─────────────────┴──┐
│    Base Material    │
└────────────────────┘
```

TABLE 2

| LAYER | TYPE OF LAYER | THICK-NESS (μm) | REAC. TEMP. (°C.) | PRES-SURE (Torr) | REACTION CONDITIONS | | | | | | | | | |
|---|---|---|---|---|---|---|---|---|---|---|---|---|---|---|
| | | | | | TIME (MIN) | REACTION GAS COMPOSITION (VOL %) | | | | | | | | |
| | | | | | | $TiCl_4$ | $CH_4$ | $CH_3CN$ | $N_2$ | CO | $AlCl_3$ | $CO_2$ | $H_2S$ | $H_2$ |
| 1st | TiN | 0.2 | 900 | 50 | | 2 | | | 25 | | | | | REM. |
| 2nd | TiCN | 9.0 | 900 | 50 | | 2 | | 0.6 | 25 | | | | | REM. |
| 3rd | TiCNO | 0.5 | 1010 | 50 | | 2 | 1 | | 15 | 1 | | | | REM. |
| 4th | $Al_2O_3$ | 2.0 | 1010 | 50 | 10 | | | | | | 6 | | | REM. 1st STEP |
| | | 2.0 | 1010 | 50 | 10 | | | | | | 5 | 4 | | REM. 2nd |
| | | 2.0 | 1010 | 50 | 120 | | | | | | 3 | 4 | 0.3 | REM. STEP |
| 5th | TiN | 0.5 | 900 | 300 | | 1 | | | 70 | | | | | REM. |

(REM. denotes remainder)

```
    ┌─────────┐
    │ 3rd Layer │
  ┌─┴─────────┴─┐
  │  2nd Layer   │
┌─┴─────────────┴─┐
│    1st Layer     │
├─────────────────┴──┐
│    Base Material    │
└────────────────────┘
```

TABLE 3

| LAYER | TYPE OF LAYER | THICK-NESS (μm) | REAC. TEMP. (°C.) | PRES-SURE (Torr) | REACTION CONDITIONS | | | | | | | | | |
|---|---|---|---|---|---|---|---|---|---|---|---|---|---|---|
| | | | | | TIME (MIN) | REACTION GAS COMPOSITION (VOL %) | | | | | | | | |
| | | | | | | $TiCl_4$ | $CH_4$ | $CH_3CN$ | $N_2$ | CO | $AlCl_3$ | $CO_2$ | $H_2S$ | $H_2$ |
| 1st | TiN | 0.5 | 900 | 120 | | 3 | | | 57 | | | | | REM. |
| 2nd | TiCN | 6.0 | 900 | 50 | | 2 | | 0.8 | 32 | | | | | REM. |
| 3rd | TiCNO | 0.5 | 1020 | 100 | | 3 | 1 | | 25 | 1 | | | | REM. |
| 4th | $Al_2O_3$ | 6.0 | 980 | 50 | 20 | | | | | | 3 | | | REM. 1st STEP |
| | | 6.0 | 980 | 50 | 30 | | | | | | 3 | 10 | | REM. 2nd |
| | | 6.0 | 980 | 50 | 300 | | | | | | 3 | 10 | 0.2 | REM STEP |

(REM. denotes remainder)

```
    ┌─────────┐
    │ 3rd Layer │
  ┌─┴─────────┴─┐
  │  2nd Layer   │
┌─┴─────────────┴─┐
│    1st Layer     │
├─────────────────┴──┐
│    Base Material    │
└────────────────────┘
```

TABLE 4

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|---|
| | | | | | TIME (MIN) | REACTION GAS COMPOSITION (VOL %) |||||||||
| | | | | | | TiCl$_4$ | CH$_4$ | CH$_3$CN | N$_2$ | CO | AlCl$_3$ | CO$_2$ | H$_2$S | H$_2$ |
| 1st | TiN | 0.5 | 920 | 120 | | 3 | | | 57 | | | | | REM. | |
| 2nd | TiCN | 6.0 | 920 | 50 | | 2 | | 0.8 | 32 | | | | | REM. | |
| 3rd | TiCNO | 0.5 | 980 | 100 | | 3 | 1 | | 25 | 1 | | | | REM. | |
| 4th | Al$_2$O$_3$ | 6.0 | 980 | 50 | 20 | | | | | | 4 | | | REM. 1st STEP |
| | | 6.0 | 980 | 50 | 30 | | | | | | 4 | 10 | | REM. 2nd |
| | | 6.0 | 980 | 50 | 300 | | | | | | 2 | 15 | 0.2 | REM. STEP |
| 5th | TiN | 0.5 | 900 | 300 | | 1 | | | 50 | | | | | REM. |

(REM. denotes remainder)

```
    ┌──────────────────┐
    │    3rd Layer     │
  ┌─┴──────────────────┴──┐
  │      2nd Layer        │
┌─┴───────────────────────┴──┐
│         1st Layer          │
├────────────────────────────┴──┐
│        Base Material          │
└───────────────────────────────┘
```

TABLE 5

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|---|
| | | | | | TIME (MIN) | REACTION GAS COMPOSITION (VOL %) |||||||||
| | | | | | | TiCl$_4$ | CH$_4$ | CH$_3$CN | N$_2$ | CO | AlCl$_3$ | CO$_2$ | H$_2$S | H$_2$ |
| 1st | TiCN | 6.0 | 870 | 50 | | 2 | | 0.8 | 32 | | | | | REM. |
| 2nd | Al$_2$O$_3$ | 6.0 | 990 | 50 | 20 | | | | | | 5 | | | REM. 1st STEP |
| | | 6.0 | 990 | 50 | 30 | | | | | | 2 | 4 | | REM. 2nd |
| | | 6.0 | 990 | 50 | 300 | | | | | | 2 | 7 | 0.5 | REM. STEP |

(REM. denotes remainder)

```
  ┌──────────────────┐
  │    2nd Layer     │
┌─┴──────────────────┴──┐
│      1st Layer        │
├───────────────────────┴──┐
│       Base Material      │
└──────────────────────────┘
```

TABLE 6

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|---|
| | | | | | TIME (MIN) | REACTION GAS COMPOSITION (VOL %) |||||||||
| | | | | | | TiCl$_4$ | CH$_4$ | CH$_3$CN | N$_2$ | CO | AlCl$_3$ | CO$_2$ | H$_2$S | H$_2$ |
| 1st | TiC | 3.0 | 1020 | 50 | | 3 | 9 | | | | | | | REM. |
| 2nd | TiCN | 3.0 | 1000 | 50 | | 3 | 7 | | 26 | | | | | REM. |
| 3rd | Al$_2$O$_3$ | 6.0 | 960 | 50 | 30 | | | | | | 1 | | | REM. 1st STEP |
| | | 6.0 | 960 | 50 | 30 | | | | | | 2 | 10 | | REM. 2nd |
| | | 6.0 | 960 | 50 | 300 | | | | | | 3 | 10 | 0.2 | REM. STEP |

(REM. denotes remainder)

```
    ┌──────────────────┐
    │    3rd Layer     │
  ┌─┴──────────────────┴──┐
  │      2nd Layer        │
┌─┴───────────────────────┴──┐
│         1st Layer          │
├────────────────────────────┴──┐
│        Base Material          │
└───────────────────────────────┘
```

TABLE 7

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|---|
| | | | | | TIME (MIN) | REACTION GAS COMPOSITION (VOL %) |||||||| |
| | | | | | | TiCl$_4$ | CH$_4$ | CH$_3$CN | N$_2$ | CO | AlCl$_3$ | CO$_2$ | H$_2$S | H$_2$ | |
| 1st | TiC | 3.0 | 1020 | 50 | | 3 | 9 | | | | | | | REM. | |
| 2nd | TiCN | 3.0 | 1000 | 50 | | 3 | 7 | | 26 | | | | | REM. | |
| 3rd | Al$_2$O$_3$ | 6.0 | 960 | 50 | 30 | | | | | | 3 | | | REM. | 1st STEP |
| | | 6.0 | 950 | 50 | 30 | | | | | | 3 | 10 | | REM. | 2nd |
| | | 6.0 | 950 | 50 | 300 | | | | | | 6 | 10 | 0.1 | REM. | STEP |
| 4th | TiN | 0.5 | 900 | 300 | | 1 | | | 55 | | | | | REM. | |

(REM. denotes remainder)

```
    ⋮
 ┌─────────┐
 │3rd Layer│──┐
 ├─────────┴┐ │
 │2nd Layer │─┤
 ├──────────┴┐│
 │1st Layer  ├┤
 ├───────────┴┤
 │Base Material│
 └─────────────┘
```

TABLE 8

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|---|
| | | | | | TIME (MIN) | REACTION GAS COMPOSITION (VOL %) |||||||| |
| | | | | | | TiCl$_4$ | CH$_4$ | CH$_3$CN | N$_2$ | CO | AlCl$_3$ | CO$_2$ | H$_2$S | H$_2$ | |
| 1st | TiCN | 5.0 | 1020 | 50 | | 3 | 7 | | 26 | | | | | REM. | |
| 2nd | Al$_2$O$_3$ | 6.0 | 930 | 50 | 20 | | | | | | 6 | | | REM. | 1st STEP |
| | | 6.0 | 930 | 50 | 360 | | | | | | 6 | 2 | 0.05 | REM. | 2nd STEP |

(REM. denotes remainder)

```
 ┌─────────┐
 │2nd Layer│──┐
 ├─────────┴┐ │
 │1st Layer │─┤
 ├──────────┴┐│
 │Base Material│
 └─────────────┘
```

40

TABLE 9

| LAYER | TYPE OF LAYER | THICK-NESS (μm) | REAC. TEMP. (°C.) | PRES-SURE (Torr) | REACTION CONDITIONS |||||||||
|---|---|---|---|---|---|---|---|---|---|---|---|---|---|
| | | | | | TIME (MIN) | REACTION GAS COMPOSITION (VOL %) |||||||| |
| | | | | | | TiCl$_4$ | CH$_4$ | CH$_3$CN | N$_2$ | CO | AlCl$_3$ | CO$_2$ | H$_2$S | H$_2$ |
| 1st | TiN | 0.2 | 910 | 50 | | 2 | | | 35 | | | | | REM. |
| 2nd | TiCN | 9.0 | 910 | 50 | | 2 | | 0.6 | 25 | | | | | REM. |
| 3rd | TiCNO | 0.5 | 1010 | 50 | | 2 | 1 | | 23 | 1 | | | | REM. |
| 4th | Al$_2$O$_3$ | 2.0 | 1020 | 50 | 120 | | | | | | 6 | 4 | 0.3 | REM. |

(REM. denotes remainder)

```
    ⋮
 ┌─────────┐
 │3rd Layer│──┐
 ├─────────┴┐ │
 │2nd Layer │─┤
 ├──────────┴┐│
 │1st Layer  ├┤
 ├───────────┴┤
 │Base Material│
 └─────────────┘
```

60

TABLE 10

| LAYER | TYPE OF LAYER | THICK-NESS (μm) | REAC. TEMP. (°C.) | PRES-SURE (Torr) | TIME (MIN) | REACTION GAS COMPOSITION (VOL %) | | | | | | | | |
|---|---|---|---|---|---|---|---|---|---|---|---|---|---|---|
| | | | | | | TiCl$_4$ | CH$_4$ | CH$_3$CN | N$_2$ | CO | AlCl$_3$ | CO$_2$ | H$_2$S | H$_2$ |
| 1st | TiN | 0.2 | 900 | 50 | | 2 | | | 25 | | | | | REM. |
| 2nd | TiCN | 9.0 | 900 | 50 | | 2 | | 0.6 | 20 | | | | | REM. |
| 3rd | TiCNO | 0.5 | 1010 | 50 | | 2 | 1 | | 23 | 1 | | | | REM. |
| 4th | Al$_2$O$_3$ | 2.0 | 1020 | 50 | 120 | | | | | | 2 | 4 | 0.3 | REM. |
| 5th | TiN | 0.5 | 900 | 300 | | 1 | | | 55 | | | | | REM. |

(REM. denotes remainder)

```
      ⋮
    ┌─────────────┐
    │  3rd Layer  │
  ┌─┴─────────────┴─┐
  │    2nd Layer    │
┌─┴─────────────────┴─┐
│      1st Layer      │
├─────────────────────┴─┐
│     Base Material     │
└───────────────────────┘
```

TABLE 11

| LAYER | TYPE OF LAYER | THICK-NESS (μm) | REAC. TEMP. (°C.) | PRES-SURE (Torr) | TIME (MIN) | REACTION GAS COMPOSITION (VOL %) | | | | | | | | |
|---|---|---|---|---|---|---|---|---|---|---|---|---|---|---|
| | | | | | | TiCl$_4$ | CH$_4$ | CH$_3$CN | N$_2$ | CO | AlCl$_3$ | CO$_2$ | H$_2$S | H$_2$ |
| 1st | TiN | 0.5 | 900 | 120 | | 3 | | | 57 | | | | | REM. |
| 2nd | TiCN | 6.0 | 900 | 50 | | 2 | | 0.8 | 32 | | | | | REM. |
| 3rd | TiCNO | 0.5 | 1020 | 100 | | 3 | 1 | | 25 | 1 | | | | REM. |
| 4th | Al$_2$O$_3$ | 6.0 | 1000 | 50 | 300 | | | | | | 3 | 10 | 0.2 | REM. |

(REM. denotes remainder)

```
      ⋮
    ┌─────────────┐
    │  3rd Layer  │
  ┌─┴─────────────┴─┐
  │    2nd Layer    │
┌─┴─────────────────┴─┐
│      1st Layer      │
├─────────────────────┴─┐
│     Base Material     │
└───────────────────────┘
```

TABLE 12

| LAYER | TYPE OF LAYER | THICK-NESS (μm) | REAC. TEMP. (°C.) | PRES-SURE (Torr) | TIME (MIN) | REACTION GAS COMPOSITION (VOL %) | | | | | | | | |
|---|---|---|---|---|---|---|---|---|---|---|---|---|---|---|
| | | | | | | TiCl$_4$ | CH$_4$ | CH$_3$CN | N$_2$ | CO | AlCl$_3$ | CO$_2$ | H$_2$S | H$_2$ |
| 1st | TiN | 0.5 | 920 | 120 | | 3 | | | 57 | | | | | REM. |
| 2nd | TiCN | 6.0 | 920 | 50 | | 2 | | 0.8 | 32 | | | | | REM. |
| 3rd | TiCNO | 0.5 | 1000 | 100 | | 3 | 1 | | 25 | 1 | | | | REM. |
| 4th | Al$_2$O$_3$ | 6.0 | 1000 | 50 | | | | | | | 3 | 10 | 0.2 | REM. |
| 5th | TiN | 0.5 | 900 | 300 | | 1 | | | 55 | | | | | REM. |

(REM. denotes remainder)

```
      ⋮
    ┌─────────────┐
    │  3rd Layer  │
  ┌─┴─────────────┴─┐
  │    2nd Layer    │
┌─┴─────────────────┴─┐
│      1st Layer      │
├─────────────────────┴─┐
│     Base Material     │
└───────────────────────┘
```

TABLE 13

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|
| | | | | | TIME (MIN) | REACTION GAS COMPOSITION (VOL %) |||||||||
| | | | | | | TiCl$_4$ | CH$_4$ | CH$_3$CN | N$_2$ | CO | AlCl$_3$ | CO$_2$ | H$_2$S | H$_2$ |
| 1st | TiCN | 6.0 | 870 | 50 | | 2 | | 0.8 | 32 | | | | | REM. |
| 2nd | Al$_2$O$_3$ | 6.0 | 1020 | 50 | 300 | | | | | | 1 | 7 | 0.5 | REM. |

(REM. denotes remainder)

```
    2nd Layer
    1st Layer
    Base Material
```

TABLE 14

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|
| | | | | | TIME (MIN) | REACTION GAS COMPOSITION (VOL %) |||||||||
| | | | | | | TiCl$_4$ | CH$_4$ | CH$_3$CN | N$_2$ | CO | AlCl$_3$ | CO$_2$ | H$_2$S | H$_2$ |
| 1st | TiC | 3.0 | 1020 | 50 | | 3 | 9 | | | | | | | REM. |
| 2nd | TiCN | 3.0 | 1000 | 50 | | 3 | 7 | | 26 | | | | | REM. |
| 3rd | Al$_2$O$_3$ | 6.0 | 1000 | 50 | 300 | | | | | | 3 | 10 | 0.2 | REM. |

(REM. denotes remainder)

```
    3rd Layer
    2nd Layer
    1st Layer
    Base Material
```

TABLE 15

| LAYER | TYPE OF LAYER | THICK-NESS (μm) | REAC. TEMP. (°C.) | PRES-SURE (Torr) | REACTION CONDITIONS ||||||||||
|---|---|---|---|---|---|---|---|---|---|---|---|---|---|
| | | | | | TIME (MIN) | REACTION GAS COMPOSITION (VOL %) |||||||||
| | | | | | | TiCl$_4$ | CH$_4$ | CH$_3$CN | N$_2$ | CO | AlCl$_3$ | CO$_2$ | H$_2$S | H$_2$ |
| 1st | TiC | 3.0 | 1020 | 50 | | 3 | 9 | | | | | | | REM. |
| 2nd | TiCN | 3.0 | 1000 | 50 | | 3 | 7 | | 26 | | | | | REM. |
| 3rd | Al$_2$O$_3$ | 6.0 | 990 | 50 | 300 | | | | | | 8 | 10 | 0.6 | REM. |
| 4th | TiN | 0.5 | 900 | 300 | | 1 | | | 55 | | | | | REM. |

(REM. denotes remainder)

```
    ⋮
    3rd Layer
    2nd Layer
    1st Layer
    Base Material
```

TABLE 16

| | | | REACTION CONDITIONS | | | | | | | | | | |
|---|---|---|---|---|---|---|---|---|---|---|---|---|---|
| | TYPE OF | THICK- NESS | REAC. TEMP. | PRES- SURE | TIME | REACTION GAS COMPOSITION (VOL %) | | | | | | | |
| LAYER | LAYER | (μm) | (°C.) | (Torr) | (MIN) | $TiCl_4$ | $CH_4$ | $CH_3CN$ | $N_2$ | CO | $AlCl_3$ | $CO_2$ | $H_2S$ | $H_2$ |
| 1st | TiCN | 5.0 | 1020 | 50 | | 3 | 7 | | 26 | | | | | REM. |
| 2nd | $Al_2O_3$ | 6.0 | 1000 | 50 | 300 | | | | | | 6 | 2 | 0.05 | REM. |

(REM. denotes remainder)

```
_____
         2nd Layer              |
_____  |
         1st Layer              |
_____  |
         Base Material          |
                                |
```

TABLE 17

| CATEGORY | | $I_A/I_B$ | RATIO (%) WHERE $I_A/I_B \geq 2$ | FRANK WEAR WIDTH (mm) AFTER 20 MIN. LASTING CONTINUOUS CUTTING TEST | LAPSE OF TIME UNTIL CHIPPING IN INTER- RUPTED CUTTING TEST (MIN.) |
|---|---|---|---|---|---|
| PRESENT | 1 | 8 | 95 | 0.21 | 10.1 |
| INVENTION | 2 | 7 | 95 | 0.20 | 8.3 |
| | 3 | 30 | 100 | 0.18 | 8.9 |
| | 4 | 25 | 100 | 0.20 | 8.8 |
| | 5 | 12 | 100 | 0.24 | 7.2 |
| | 6 | 6 | 90 | 0.27 | 7.9 |
| | 7 | 5 | 90 | 0.26 | 8.5 |
| | 8 | 2 | 100 | 0.31 | 7.0 |
| PRIOR | 1 | 0.7 | *0 | 0.44 | 5.3 |
| ART | 2 | 0.7 | 0 | 0.43 | 5.5 |
| | 3 | 0.9 | 0 | 0.51 | 5.0 |
| | 4 | 0.9 | 0 | 0.54 | 5.1 |
| | 5 | 0.2 | 0 | 0.49 | 4.0 |
| | 6 | 0.6 | 0 | 0.53 | 5.2 |
| | 7 | 0.5 | 0 | 0.50 | 5.8 |
| | 8 | 0.7 | 0 | 0.62 | 2.1 |

*This ratio is set to 0 since the conventional surface coated cutting tools contain no special k-type $Al_2O_3$ of $I_A/I_B \geq 2$, though containing normal k-type $Al_2O_3$ $I_A/I_B < 2$.

40

TABLE 18

| TM 4-0878 | | | | | | k-$Al_2O_3$ KAPPA ALUMINUM OXIDE | | | k-$Al_2O_3$ KAPPA ALUMINA | | |
|---|---|---|---|---|---|---|---|---|---|---|---|
| d | 1.39 | 2.57 | 2.11 | 6.2 | | | | | | | |
| $I/I_1$ | 100 | 80 | 80 | 30 | | dÅ | $I/I_1$ | hkl | dÅ | $I/I_1$ | hkl |
| Rad. CuKα | λ 1.5405 | | | Filler | Yes | 6.2 | 30 | | 1.49 | 30 | |
| Dia. 144MM | Cut off | | | Coll. | | 4.5 | 20 | | 1.45 | 30 | |
| $I/I_1$ VISUAL | | | | d corr. abs.? | | 4.2 | 10 | | 1.43 | 80 | |
| Ref. STUMPF ET AL., IND. END. CHEM. 42 1398–1403 (1950) | | | | | | 3.04 | 40 | | 1.39 | 100 | |
| Sys. | | | | S.G. | | 2.79 | 60 | Face A | 1.34 | 30 | |
| $a_0$ | $b_0$ | $c_0$ | | A | C | 2.70 | 20 | | | | |
| α | β | λ | | Z | | 2.57 | 80 | Face B | | | |
| 8a | | nωβ | | εγ | Sign | 2.41 | 30 | | | | |
| 2V | D | mp | | Color | | 2.32 | 40 | | | | |
| Ref. | | | | | | 2.26 | 10 | | | | |
| ALPHA ALUMINA TRIHYDRATE HEATED 1 HOUR AT 1000° C. | | | | | | 2.16 | 10 | | | | |
| IN ROOM AIR. | | | | | | 2.11 | 80 | | | | |
| D- AND I-VALUES REVISED BY STUMPF IN 1960, USING | | | | | | 2.06 | 30 | | | | |
| CORUNDUM AS STANDARD. | | | | | | 1.99 | 40 | | | | |
| | | | | | | 1.95 | 20 | | | | |
| | | | | | | 1.87 | 60 | | | | |
| | | | | | | 1.82 | 30 | | | | |
| | | | | | | 1.74 | 20 | | | | |
| | | | | | | 1.64 | 60 | | | | |

TABLE 18-continued

| | |
|---|---|
| 1.54 | 10 |

Faces A and B are faces specified in ASTM as follows: Face A: d = 2.79Å, Face B: d = 2.57Å. d-values of the faces A and B may vary due to a lattice defect, but even the faces defined by those varied values may be assumed to be faces A and B.

As is clear from the results shown in TABLE-17, a value of $I_A/I_B$, of K-type alumina of any of the inventive cutting tools 1 to 8 is not smaller than 2. On the contrary, a value of $I_A/I_B$ of K-type alumina of any of the conventional cutting tools 1 to 8 is smaller than 2. Further, any of the inventive cutting tools 1 to 8 demonstrates a smaller wear width on the flank in the continuous cutting test and has longer lapse of time until chipping in the interrupted cutting test, compared with the conventional cutting tools 1 to 8.

Thus, the surface coated cutting tool according to the invention has a better performance than the conventional ones, and the use thereof leads to a reduced number of replacements, thereby contributing greatly to development of industries.

While various embodiments of and materials for uses in the invention have been described in detail, those skilled in the art will appreciate that certain modifications may be made which do not depart from the scope of the invention as defined in the appended claims.

What is claimed:

1. A cutting tool comprising a substrate whose surface is coated with a composite hard layer including an inner layer having at least one layer selected from the group consisting of titanium carbide, titanium nitride, titanium carbonitride, titanium carboxide, and titanium oxicarbonitride, and an outer layer having at least one alumina layer, wherein the alumina layer contains a K-type alumina such that an X-ray intensity ratio $I_A/I_B$ of two specific crystal faces A and B in X-ray diffraction is not smaller than 2, where the faces A and B denote faces of K-type alumina defined as those whose interfacial distances are 2.79Å in ASTM4-0878, and $I_A$ and $I_B$ denote X-ray intensities of the faces A and B in X-ray diffraction.

2. A cutting tool according to claim 1, wherein the amount of u-type alumina in the alumina layer is at least not less than 30%.

3. A cutting tool according to claim 1, wherein the amount of u-type alumina in the alumina layer is at least not less than 50%.

4. A cutting tool according to claim 1, wherein the amount of K-type alumina in the alumina layer is at least not less than 70%.

5. A cutting tool according to claim 1, wherein the K-type alumina is obtained by holding the substrate in a mixed gas comprising $AlCl_3$ and $H_2$ in the absence of $CO_2$ gas in a first step, followed by reaction in a mixed gas comprising $CO_2$ and $AlCl_3$ in a second step.

6. A cutting tool according to claim 5, wherein the mixed gas of at least one of the first and second steps includes HCl.

7. A cutting tool according to claim 5, wherein the first step is conducted at a temperature of 800° to 1050° C. for 1 to 120 minutes, and the mixed gas comprises 0.5 to 20 vol. % of $AlCl_3$, 0 to 20 vol. % of HCl and the remainder is $H_2$.

8. A cutting tool according to claim 5, wherein the second step is conducted at a temperature of 800° to 1050° C. and the mixed gas comprises 0.5 to 30 vol. % of $CO_2$, 0.5 to 20 vol. % of $AlCl_3$, 0 to 20 vol. % of HCl and the remainder is $H_2$.

9. A cutting tool according to claim 1, wherein the K-type alumina is obtained by an alumina coating reaction wherein the substrate is exposed to a mixed gas comprising $AlCl_3$ in the absence of $CO_2$, and then exposed to a mixed gas comprising $AlCl_3$ and $CO_2$.

* * * * *